United States Patent [19]

Shibamiya

[11] Patent Number: 4,910,689

[45] Date of Patent: Mar. 20, 1990

[54] RESISTIVITY VALUE MEASURING CIRCUIT

[75] Inventor: Yoshikazu Shibamiya, Tokyo, Japan

[73] Assignee: Canon Kabushiki Kaisha, Tokyo, Japan

[21] Appl. No.: 134,035

[22] Filed: Dec. 17, 1987

[30] Foreign Application Priority Data

Dec. 25, 1986 [JP] Japan .................. 61-313164
Dec. 25, 1986 [JP] Japan .................. 61-313165

[51] Int. Cl.$^4$ .............................. G05B 1/06
[52] U.S. Cl. ................................... 364/556
[58] Field of Search ............. 364/556, 557, 558

[56] References Cited

U.S. PATENT DOCUMENTS

| 4,272,822 | 6/1987 | Yasuhara et al. | 364/556 |
| 4,398,426 | 8/1983 | Park et al. | 364/558 |
| 4,468,968 | 9/1984 | Kee | 364/558 |
| 4,479,190 | 10/1984 | Takai et al. | 364/556 |
| 4,490,803 | 12/1984 | Briggs | 364/558 |

OTHER PUBLICATIONS

E. Lubairn, "On the use of thermistor anemometry in a variable temperature flow", Oct. 1980, pp. 307–312.

Primary Examiner—Parshotam S. Lall
Attorney, Agent, or Firm—Fitzpatrick, Cella, Harper & Scinto

[57] ABSTRACT

A resistivity value measuring circuit comprises: a capacitor to accumulate charges; a switch to electrically connect a device to be measured such as a thermistor with the capacitor; a transistor to discharge the charges accumulated in the capacitor; and a measuring circuit to repetitively measuring the first time and the second time by performing the connecting operation by the switch. The first time corresponds to the period of time until the voltage of the capacitor which is accumulated by only a reference device as a constant resistivity becomes a predetermined value. The second time corresponds to the period of time until the voltage of the capacitor which is accumulated by the parallel connection of the reference device and the thermistor becomes the predetermined value. A measurement value of the thermistor and the ratio of the first and second times are made correspond on the basis of the result of the measurement of the measuring circuit. With this circuit, a resistivity value of the thermistor can be cheaply and accurately detected.

12 Claims, 7 Drawing Sheets

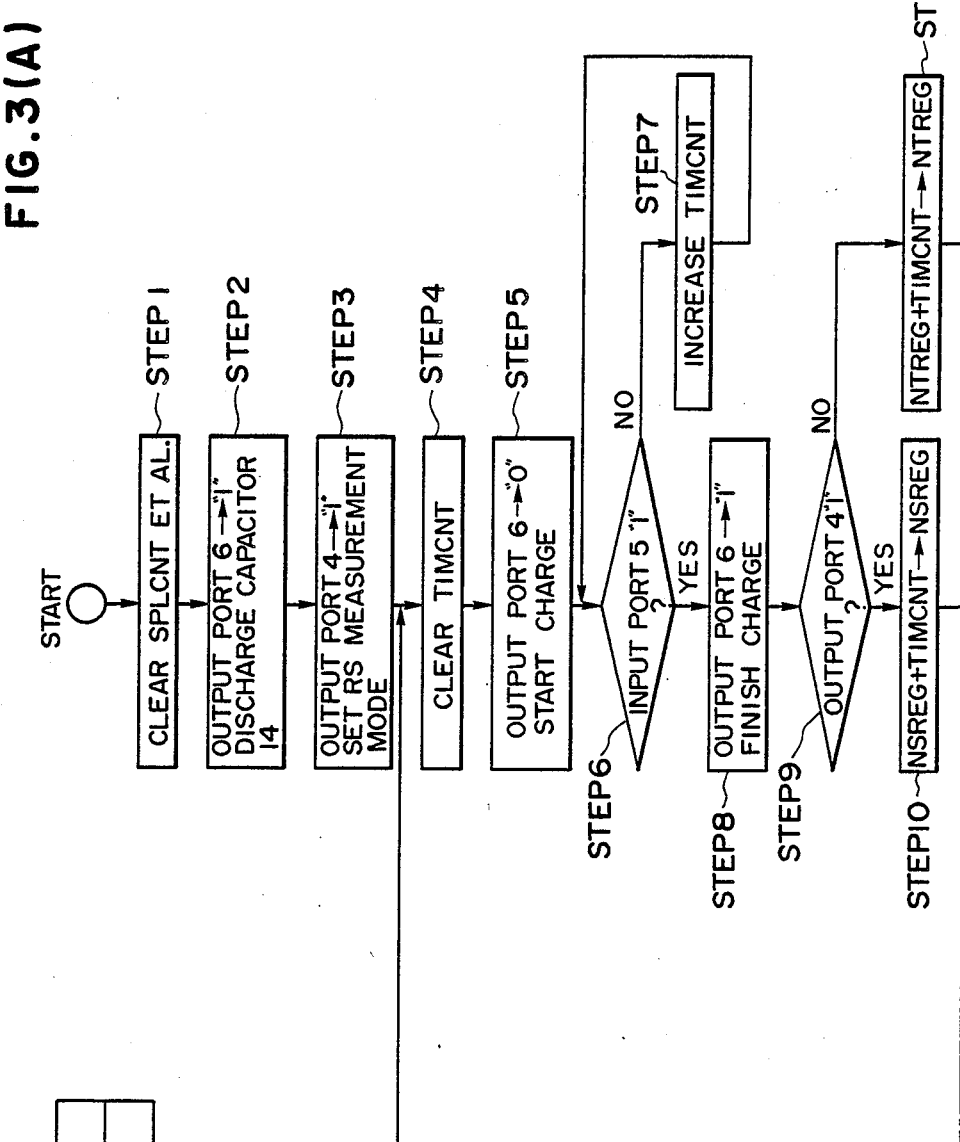

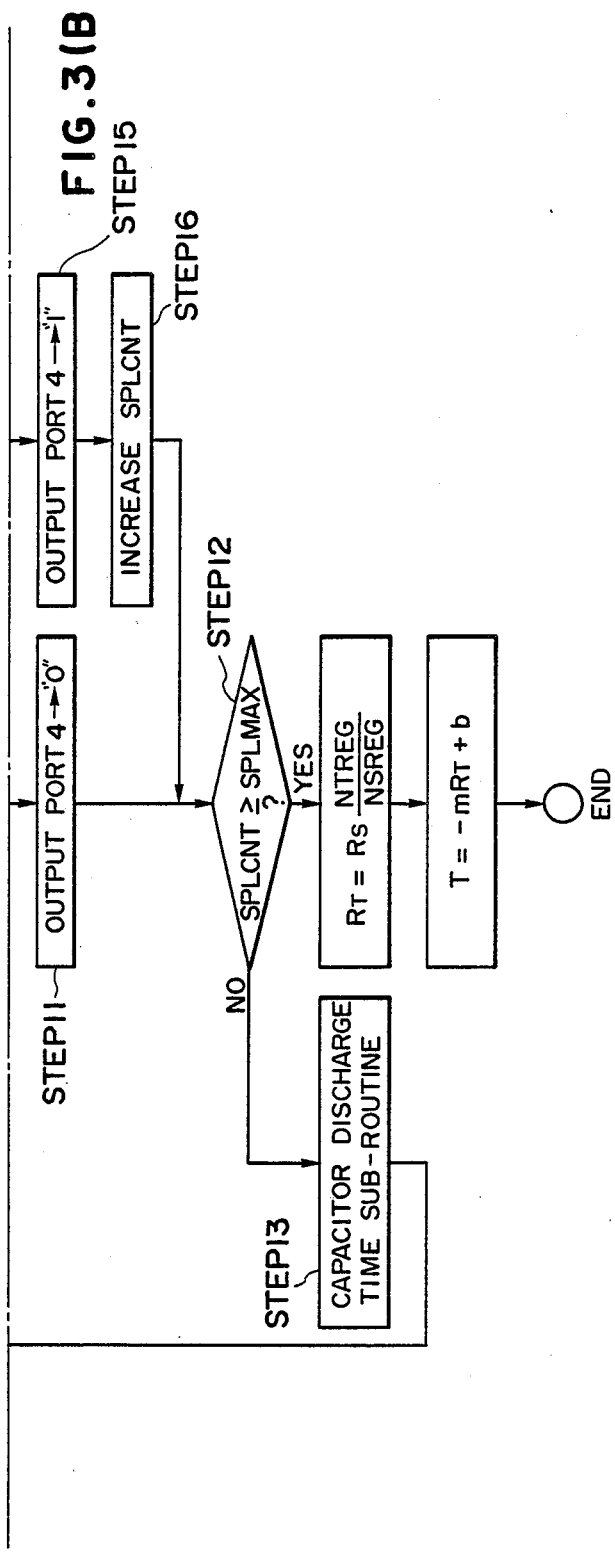

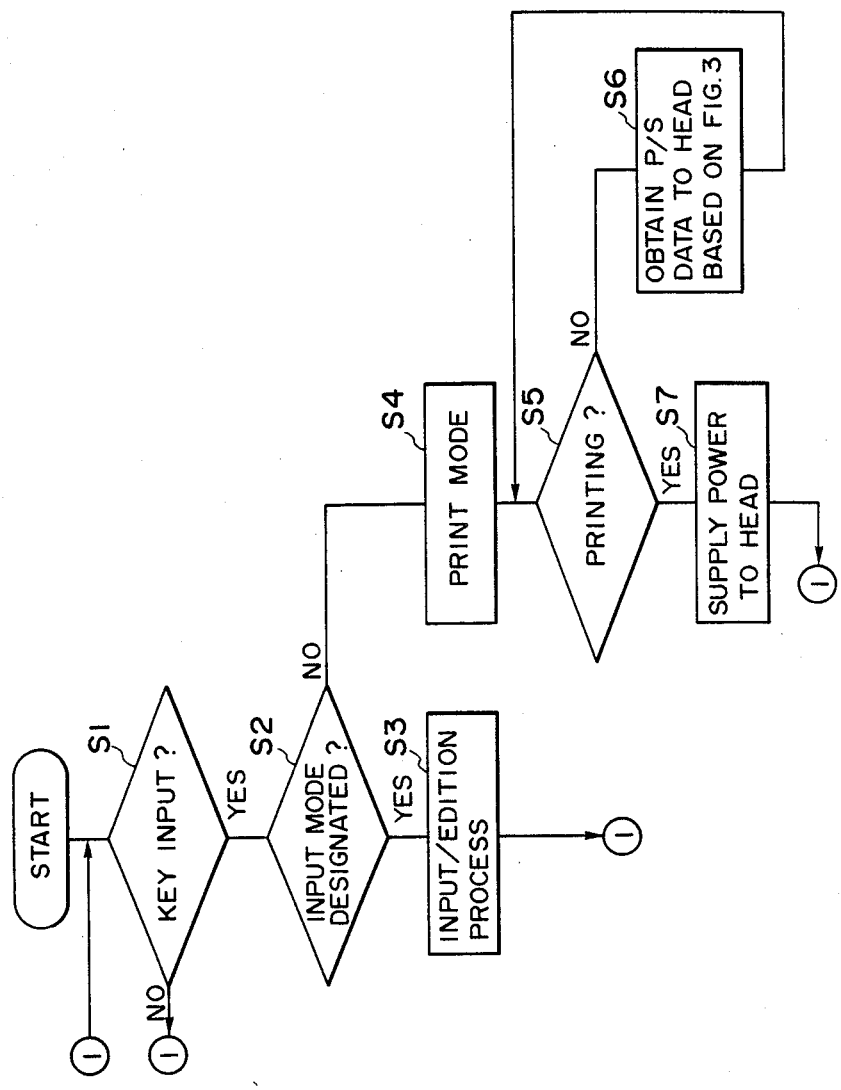

RESISTIVITY VALUE MEASURING CIRCUIT

BACKGROUND OF THE INVENTION

1. Field of the Invention

The present invention relates to an apparatus for detecting a change in environment such as temperature, pressure, or the like and, more particularly, to a resistivity value measuring circuit having a detecting device whose resistivity value changes in dependence on the foregoing change.

2. Related Background Art

Hitherto, the operations of apparatuses which are used in the world (e.g., in the case of the thermal head, the heating operation of the head) are influenced by many environmental parameters such as temperature, humidity, pressure and the like. Therefore, it is necessary to perform the controls according to the values of those parameters. Recently, a microcomputer is frequently used to perform those controls. For this purpose, the environmental parameters need to be binarized to digital values and to input them into the microcomputer. On the other hand, as an environment detecting device, a device whose resistivity values change in response to changes in temperature, humidity, pressure, and the like is frequently used. Conventionally, as methods whereby the changes in those resistivity values are binarized and input into the microcomputer, the following methods have been known: a method as shown in FIG. 4 whereby a detecting device 21 such as a thermistor or the like is serially connected to a constant resistor 22 and connected to a constant voltage source, and a change in voltage at the connecting point is converted from a continuous value into a binary value by an A/D converter 23 and input; a method as shown in FIG. 5 whereby the detecting device 21 is arranged for a charge resistor of a monostable multivibrator 24 and the monostable multivibrator 24 is reset and the period of time when the output is generated is measured by a counter 25; and the like. However, these methods have drawbacks such that the cost is high, errors occur for a variation and fluctuation in devices and power source, and the like. Reference numeral 26 denotes a CPU and 27 is a linearity correciing resistor. The temperature-resisance characteristic of the thermistor 21 exponentially changes as shown by a curve A in FIG. 6. Therefore, a resistor is inserted in parallel or in series to the thermistor, thereby correcting so that the temperature-resistance characteristic becomes almost linear within a measurement range as shown by a straight line B in FIG. 6.

SUMMARY OF THE INVENTION

In consideration of the foregoing problems, it is an object of the present invention to provide a resistivity value detecting circuit of a simple constitution and a low cost in which the period of time to accumulate the charges into a charge accumulation device until a predetermined voltage is measured twice with respect to two cases where only a reference resistivity is used and where the reference resistivity and a device to be measured are arranged in parallel, the ratio of the measured time periods is calculated and set into the measurement value, thereby enabling the resistivity value of the measurement device to be measured, or to provide an electronic apparatus including such a detecting circuit.

In consideration of the foregoing problems, another object of the invention is to provide a resistivity value measuring circuit of a simple constitution and a low cost in which the period of time to accumulate the charges into a charge accumulation device until a predetermined voltage is measured twice with respect to two cases where only a reference resistivity is used and where the reference resistivity and a device to be measured are arranged in parallel, the ratio of the measured time periods is calculated and set into the measurement value, thereby enabling the resistivity value of the measurement device to be measured, or to provide an electronic apparatus including such a measuring circuit.

Still another object of the invention is to provide a resistivity value measuring circuit in which the foregoing measuring operation is repeated a predetermined number of times and the ratio of the sum of the foregoing first time periods and the sum of the foregoing second time periods is obtained and the value to be obtained is calculated, thereby enabling a measuring apparatus of a low cost, a high stability, and a high accuracy to be derived.

Still another object of the invention is to provide a resistivity value measuring circuit in which if the value to be obtained is not the value of the device to be measured but the parallel value with a reference resistivity, the foregoing ratio is made proportional to the value to be obtained.

BRIEF DESCRIPTION OF THE DRAWINGS

FIGS. 3, 3a and 3b constitute a flowchart showing a flow of the operation of the embodiment;

FIG. 8 is a control flowchart of the whole apparatus.

DETAILED DESCRIPTION OF THE PREFERRED EMBODIMENTS

An embodiment of the present invention will now be described in detail hereinbelow.

Figure 1:
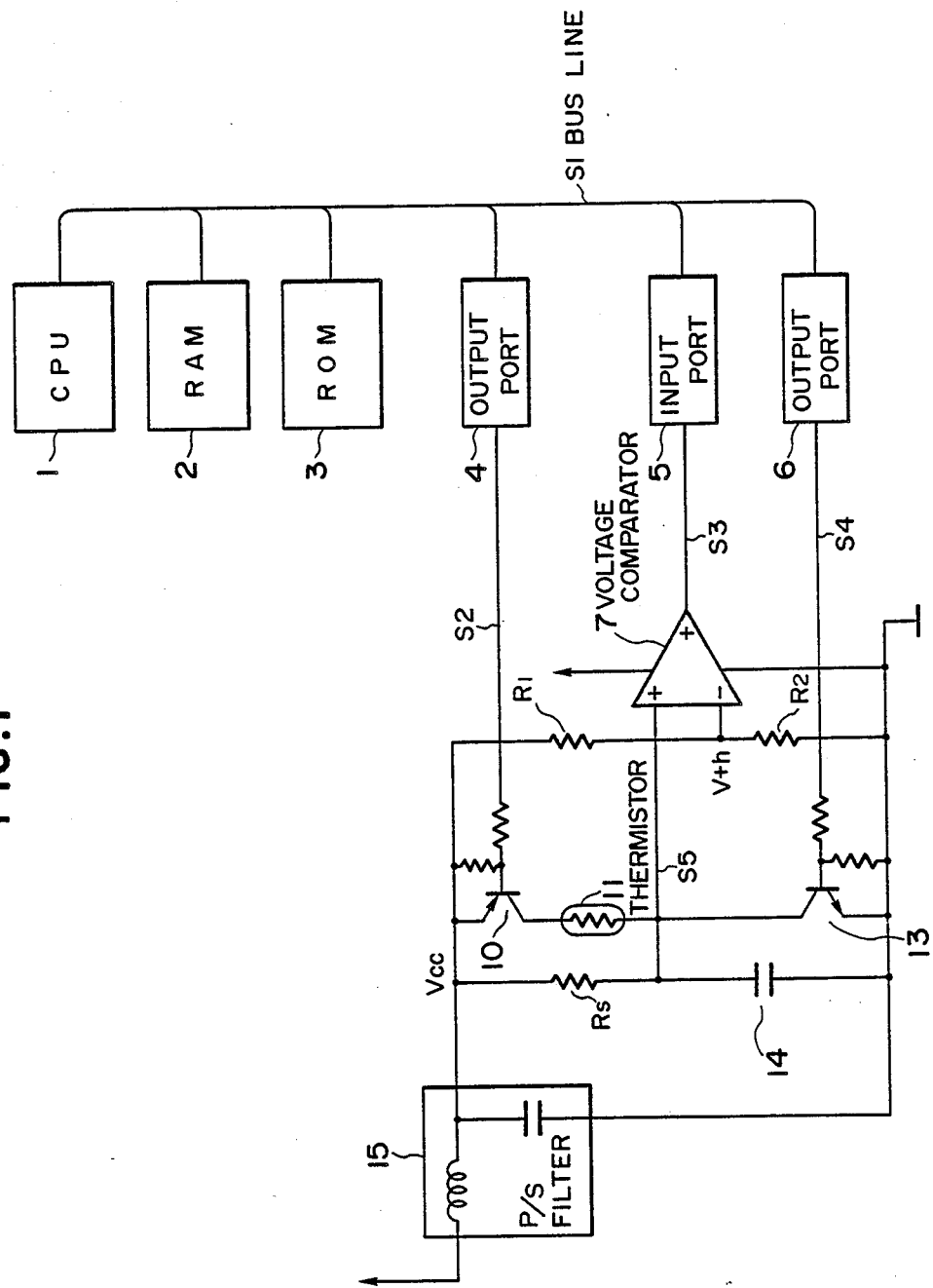
FIG. 1 is a block diagram of a resistivity value measuring circuit in an embodiment of the present invention.

An explanation will be made with respect to an example in which the invention is applied to detect a temperature by a temperature dependence resistor (hereinafter, referred to as a thermistor). FIG. 1 shows a block diagram of this embodiment.

In FIG. 1, a microprocessor (CPU) 1 reads out a program command and predetermined data from an ROM 3, which will be explained herein later, and performs the arithmetic operations and comparison and the like which are necessary to detect a temperature.

In an apparatus shown in FIG. 7, which will be explained hereinafter, it will be obviously understood that patterns are read out of a character generator (not shown) on the basis of the input data from a keyboard and a current supply to thermal heads corresponding to each pattern is controlled.

An RAM 2 is a read/write memory which is used as a timer register in the case where the CPU 1 temporarily stores input/output data into/from input/output ports 4 to 6, which will be explained hereinafter, and measures the period of time. The RAM 2 is also used as a memory or the like to store the results of the arithmetic operations by the CPU 1. (Refer to FIG. 2(a))

The ROM 3 is a read only non-volatile memory. A system program by which the CPU 1 operates, comparison tables for allowing the results of the arithmetic operations to correspond to the actual temperature value, and the like are stored in the ROM 3. (Refer to FIG. 2 (b)).

The output port 4 latches the logic level "0" or "1" through a bus line $S_1$ in response to a command of the CPU 1 and controls a transistor 10, which will be explained hereinlater, through a bus line $S_2$. The input port 5 can read through the bus line $S_1$ the logic level "0" or "1" which was output through a signal line $S_3$ from a voltage comparator 7, which will be explained hereinlater.

In a manner similar to the output port 4, the output port 6 latches the logic level "0" or "1" and controls a transistor 13, which will be explained hereinafter, through a signal line $S_4$.

The output port 4 and the output port 6 can also read out the latched contents in response to commands of the CPU 1.

The voltage comparator 7 compares a value of a signal line $S_5$ as a terminal voltage $V_c$ of a capacitor 14 with a reference voltage $V_{th}$. When the reference voltage $V_{th}$ is higher than the terminal voltage $V_c$, the comparator 7 outputs the logic level "0". When the terminal voltage $V_c$ is higher than the reference voltage $V_{th}$, the comparator 7 outputs the logic level "1". A resistor $R_1$ and a resistor $R_2$ are voltage dividing resistors to make the reference voltage $V_{th}$ of the voltage comparator 7.

$$V_{th} = \frac{(R_2)}{R_1 + R_2} V_{cc} \quad (1)$$

where, $V_{cc}$ is a power source voltage

When the logic level of the signal line $S_2$ is "1", the circuit between the collector and the emitter of the transistor 10 is in the off state, so that no current flows through a thermistor 11, which will be explained hereinafter, and no current is charged. On the contrary, when the logic level of the signal line $S_2$ is "0", the circuit between the collector and the emitter is in the on state, so that a current can flow through the thermistor 11.

Figure 6:
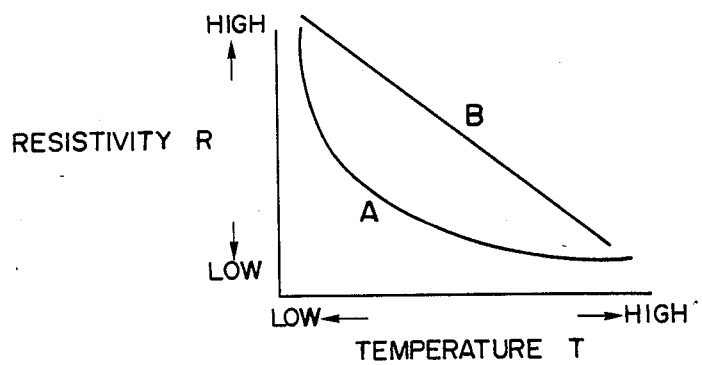
FIG. 6 is a diagram showing the characteristic of a thermistor.

The thermistor 11 has a temperature dependency and is the device whose resistivity value changes in dependence on the temperature. Assuming that the resistivity value of the thermistor is $R_{TH}$, its logic expression is $$R_{TH} = R_0 \exp\left[B_0\left(\frac{1}{T} - \frac{1}{T_0}\right)\right] \quad (2)$$

where,
$R_0$, $B_0$ specific constants of the thermistor
$T_0$: 273[°K.]
T: temperature of the thermistor [°K.]
As mentioned above, the temperature-resistivity value characteristic is shown as a curve A in FIG. 6. As will be understood from this graph, the temperature-resistivity value curve of the thermistor is not a straight line.

By connecting a constant resistor in parallel and correcting this characteristic, the excellent linearity can be provided. Therefore, in general, this method is frequently used in the temperature detection using a thermistor.

A reference resistivity $R_s$ is a constant resistivity also serving as a reference resistivity to correct the linearity of the thermistor and to measure the reference time. In this invention, a high accuracy is needed for only this part. However, the cost of this part is fairly lower than the conventional one.

When the logic level of the signal line $S_4$ is "1", the circuit between the collector and the emitter of the transistor 13 is in the on state, so that the charges in the capacitor 14, which will be explained hereinlater, are discharged. When the logic level of the signal line $S_4$ is "0", the circuit between the collector and the emitter of the transistor 13 is in the off state, so that no charge is discharged.

The capacitor 14 charges the charges flowing through a reference resistivity $R_s$ and thermistor 11 (with a resistivity value, $R_{th}$)

A power source (P/S) filter 15 is provided to eliminate the impulse noises.

The registers and the like which are used in the RAM 2 and ROM 3 in the embodiment will now be explained with reference to FIGS. 2(a) and 2(b).

Figure 2A:
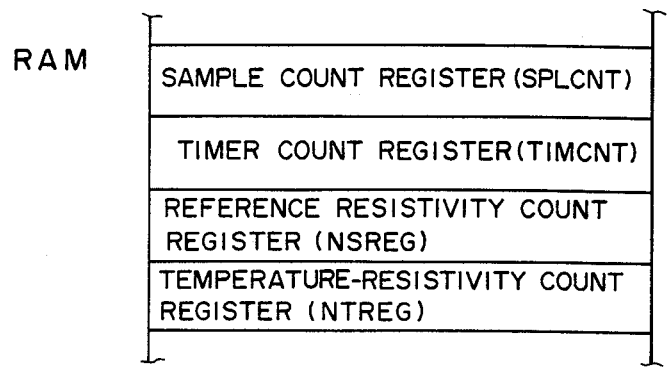
FIGS. 2a and 2b constitute a diagram for explaining the contents of an RAM 2 and an ROM 3.

As shown in FIG. 2(a), a sample count register (hereinafter, abbreviated to SPLCNT) and a timer count register (hereinafter, abbreviated to TIMCNT) are provided in the RAM 2. These registers are assigned into special addresses in the RAM 2, respectively.

The SPLCNT is used to count the number of measurement times.

On the other hand, the TIMCNT is used to measure the period of time until the capacitor 14 is charged to the reference voltage $V_{th}$ after the capacitor 14 discharged. The count value of the TIMCNT is increased every predetermined period of time in accordance with the program. This predetermined period of time is set to the minimum unit of the measurement time.

In addition, a reference resistivity count register (hereinafter, abbreviated to NSREG) and a temperature-resistivity count register (hereinafter, abbreviated to NTREG) are provided in the RAM 2. The count value measured by use of a reference resistivity is held in the NSREG. The count value measured by use of a parallel connection of the reference resistivity and the thermistor is held in the NTREG. In this manner, two kinds of measurement count values are held in the tow registers in the RAM 2 and used.

Figure 2B:
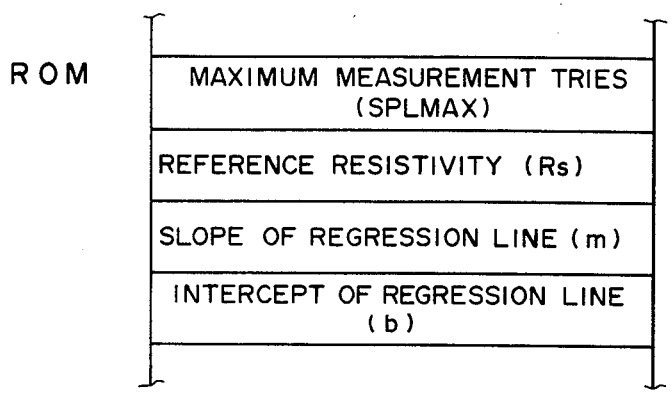
Figure 4:
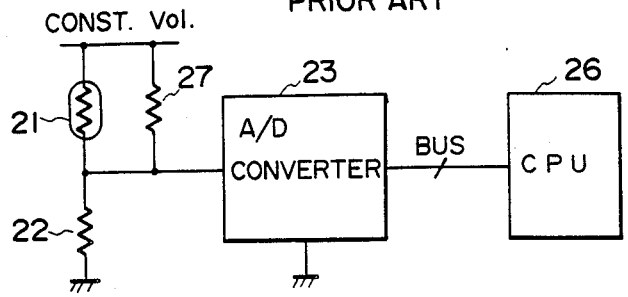
FIG. 4 is a diagram showing an example of a conventional measuring circuit.
Figure 5:
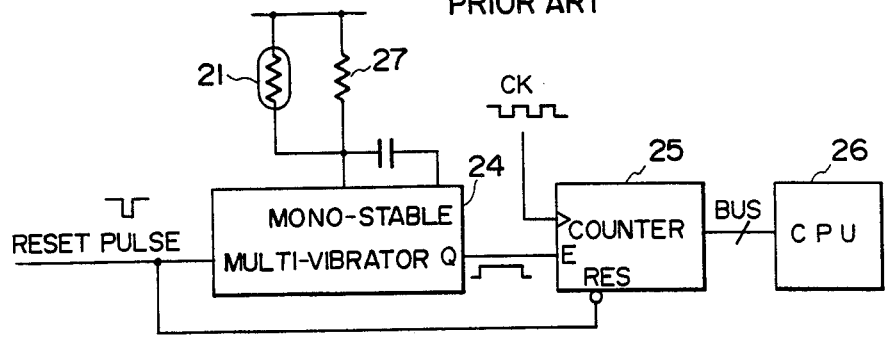
FIG. 5 is a diagram showing another example of a conventional measuring circuit.

On the other hand, as shown in FIG. 2(b), the maximum measurement tries (hereinafter, abbreviated to SPLMAX), the reference resistivity $R_s$, a slope (m) of regression line, and the value of the intercept (b) of regression line are stored as constants in the ROM 3. The slope m and intercept b are obtained by the method of least squares so as to minimize the square error for the curve of the synthetic resistivity $R_T$ and the temperature T. The synthetic resistivity $R_T$ is obtained by connecting the reference resistivity $R_s$ and the thermistor $R_{th}$ in parallel on the basis of the constants $B_0$ and $R_0$ of the thermistor which is used together with the $R_s$.

Prior to describing the operation of the embodiment, the principle will now be simply explained hereinbelow.

In FIG. 1, the capacitor 14 is charged through the reference resistivity $R_s$ by the power source voltage $V_{cc}$. The time $t_s$ until the voltage reaches the reference voltage $V_{th}$ becomes $$t_s = -CR_s \ln\left(1 - \frac{V_{th}}{V_{cc}}\right) \text{[second]} \quad (4)$$

since $$V_{th} = V_{cc}\left(1 - e - \frac{t_s}{CR_s}\right)[V] \quad (3)$$

When the time $t_s$ is measured by a counter to count once every $t_0$ seconds, the count number $N_s$ becomes $$N_s = \frac{t_s}{t_0} = -\frac{CR_s}{t_0}\left(1 - \frac{V_{th}}{V_{cc}}\right)\text{[times]} \quad (5)$$

By repeating the above operations k times, the mean value $\overline{N_s}$ becomes $$\overline{N_s} = \frac{\sum_{i=1}^{k} N_{si}}{k} \text{ [times]} \quad (6)$$

In a manner similar to the above, the capacitor 14 is charged through a parallel synthetic resistivity $R_T$ of the reference resistivity $R_s$ as the resistivity to be measured and the thermistor 11 and this operation is repeated k times. Thus, $$\overline{N_T} = \frac{\sum_{i=1}^{k} N_{Ti}}{k} \text{ [times]} \quad (7)$$

is obtained. By calculating the ratio of the equations (6) and (7), $$\frac{\overline{N_s}}{\overline{N_T}} = \frac{\sum_{i=1}^{k} N_{si}}{\sum_{i=1}^{k} N_{Ti}} \quad (8)$$

is obtained, In this case, the fluctuations in $V_{cc}$, $V_{th}$, C, and $t_0$ are so small that can be ignored within the charge time. Therefore, assuming that they are equal within the charge time, $$R_T = R_s = \frac{\sum_{i=1}^{k} N_{Ti}}{\sum_{i=1}^{k} N_{si}} \quad (k \geq 1)[\Omega] \quad (9)$$

is obtained. The value of the resistivity $R_T$ to be measured is obtained by multiplying the reference resistivity $R_s$ to the ratio of the sum of the count values of k times (k is an arbitrary value of 1 or more) and the sum of the other count value of k times. It will be understood that the resistivity $R_T$ to be measured is independent of $V_{cc}$, $V_{th}$, C, and $t_0$. The invention is embodied on the basis of this principle.

The operation of the invention will now be explained with reference to FIG. 1 and a flowchart of FIG. 3 for explaining a flow of the operation.

First, "0" is set into the SPLCNT, NSREG, and NTREG in the RAM 2 (namely, they are cleared) (step 1).

Next, "1" is output to the output port 4, the transistor 10 is turned off, and the reference resistivity measurement mode is set. "1" is output to the output port 6, this state is held for a predetermined period of time, and the capacitor 14 is perfectly discharged (steps 2 and 3). Next, the TIMCNT is cleared (step 4). In this manner, the preparation for measurement is completed. "0" is output to the output port 6, the transistor 13 is turned off, and the charge to the capacitor 14 by only the reference resistivity $R_s$ is started (step 5). The CPU 1 reads out the data from the input port 5 every constant time. If the value is "0", the CPU 1 increases the count value of the TIMCNT in the RAM 2 and again reads out the data from the input port 5. These operations are repeated (steps 6 and 7). When the terminal voltage $V_c$ of the capacitor 14 exceeds the reference voltage $V_{th}$, the voltage comparator 7 is inverted, so that "1" is output from the input port 5. When the CPU 1 detects that "1" was output from the input port 5, the CPU 1 stops the increase in count number of the TIMCNT. Then, "1" is output to the output port 6 and the charge is completed (step 8).

The CPU 1 then decides whether the output port 4 is set to "0" or "1" (step 9). When it is set to "1", the value of the TIMCNT in which the increase in count value has just been stopped, is added to the value of the NSREG (which is at present set to "1") and set into the NSREG (step 10). The output port 4 is inverted from "1" to "0" (step 11). The transistor 10 is turned on. The reference resistivity and the thermistor are connected in parallel and the temperature-resistivity measurement mode is set.

Next, the value of the SPLCNT in the RAM 2 is compared with the value o the maximum measurement tries SPLMAX in the ROM 3 (step 12). At present, the value of the SPLCNT is "0" and SPLCNT <SPLMAX. In this case, the processing routine is returned to step 4 in order to perform the next measurement. The charge in the capacitor 14 are discharged and the charge to the capacitor 14 is restarted. When the CPU 1 detects that the input port 5 is set to "1" and the increase in count value of the TIMCNT is stopped (steps 6 and 8), the output port 4 is set to "0". At this time, the value of the NTREG and the vauue of the TIMCNT are added and set into the NTREG (step 14). The output port 4 is again inverted from "0" to "1" (step 15). The next measurement mode is reset to the reference resistivity measurement mode and a the same time, the SPLCNT is increased (step 16). Thereafter, the SPLCNT and SPLMAX are compared. If SPLCNT <SPLMAX, the processing routine is returned to step 2 and the measurement is restarted.

When SPLCNT ≧ SPLMAX, the measurement is finished the number of times corresponding to the maximum measurement tries SPLMAX. The sum of the count numbers in the case where the capacitor 14 was charged by the reference resistivity the number of times of the SPLMAX is stored in the NSREG. The sum of the count numbers in the case where the reference resistivity and the thermistor were connected in parallel and the capacitor was charged the number of times of the SPLMAX is stored in the NTREG.

Next, the CPU 1 calculates the ratio NTREG/NSREG of the values of the two registers NSREG and NTREG. This ratio if multiplied with the value of the $R_s$ held as the data in the ROM 3, thereby calculating the resistivity value $R_T$ to be measured. Further, from the slope m of regression line and the intercept b of regression line which have previously been obtained and stored in the ROM 3, the temperature T is finally obtained by calculating the following equation using the $R_s$ and the constants $B_0$ and $R_0$ of the thermistor to be measured.

$$T = -mR_T + b$$

(Another embodiment)

The foregoing embodiment has been described with respect to the temperature detecting circuit using the temperature dependency resistivity device (thermistor) as the detecting device. However, it is also possible to use any device or substance whose resistivity value changes in dependence on something. Such a detecting device can be also used to measure what is called a resistor itself. The invention is not limited to the transistors 10 and 13 but can also use FET or relays. On the other hand, although the comparator and reference voltage have been used as the voltage comparing means, the threshold voltage of a gate IC can be also directly used for the purpose of the reduction of the cost. On the other hand, in this embodiment, the soft timer using the loop of the software has been used as the time measuring means. However, a timer unit which is frequently provided in the recent microcomputer and the interruption can be also used as the time measuring means or an external counter can be also provided. In the embodiment, the calculating equations have been use to obtain the actual temperature from the two measurement values $N_T$ and $N_S$. However, since the ratio $N_T/N_S$ corresponds to the actual temperature, it is also possible to constitute in such a manner that this ratio is divided into several levels and the table data corresponding to these levels is previously stored into the ROM and the actual temperature is obtained by referring to the table data. Further, in most cases, the actual necessary data is not the temperature value itself but the control parameter corresponding to the temperature. In this case, it is sufficient to divide the ratio $N_T/N_S$ into several levels and to previously store the table data corresponding to the values of those levels into the ROM as mentioned above.

The present invention can be applied to various fields. For example, it can be also applied to detect the environment of a thermal printer of a typewriter or the like. The always high quality print can be realized by a simple circuit with a very low cost.

Figure 7:
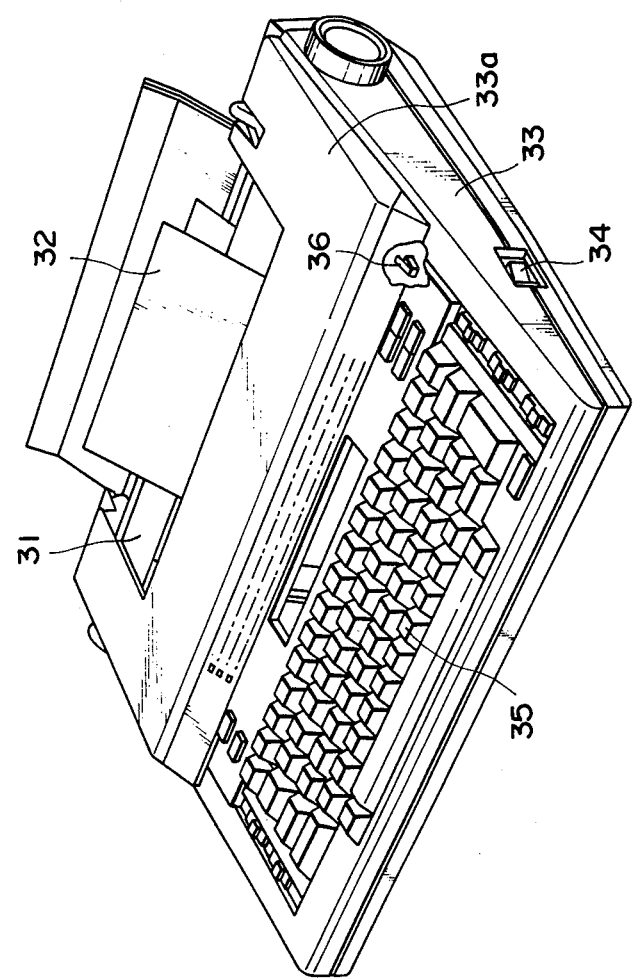
FIG. 7 is an external view of a printing apparatus in which the resistivity value measuring circuit of the invention can be installed.

FIG. 7 is an external view of a printing apparatus to which the resistivity value measuring circuit according to the invention can be applied.

In the diagram, reference numeral 31 denotes a platen; 32 is a print paper; 33 an outer casing; 34 a power switch to turn on or off a power source; 35 a keyboard; and 36 a hood switch which is turned on or off by opening or closing a hood 33a. The hood switch 36 detects the opening or closure of the hood 33a. When the hood 33a is opened, the hood switch 33 generates a signal to shift an ink ribbon to a predetermined position or the like. The keyboard is locked by this signal.

As explained in detail above, by merely using the reference resistivity with a good accuracy, the variations in capacitor, reference voltage of the voltage comparator, and power source voltage can be ignored. Therefore, a resistivity measuring circuit of a high accuracy can be realized without adjustment. On the other hand, as compared with the circuit using the A/D converter, monostable multivibrator, and the like, the cost can be fairly reduced. Further, by use of the circuit of the invention, for example, the high quality print and low cost of the printer can be realized.

As explained in detail above, by merely using the reference resistivity of a high accuracy, the variations in capacitor, reference voltage of the voltage comparator, and power source voltage can be ignored, so that the resistivity measuring circuit of a high accuracy can be realized without adjustment. On the other hand, as compared with the circuit using the A/D converter, monostable multivibrator, and the like, the cost can be fairly reduced. According to the invention, by calculating the ratio of the sum of several measurement values of the charge time in the case of the resistivity and the sum of those in the case of the parallel synthetic resistivity, if the reference resistivity of a high accuracy is used, the variations and fluctuations in the other devices and voltage can be ignored. The temperature measuring apparatus of a high accuracy and a very low cost can be obtained without adjustment.

Further, by use of the circuit of the invention, for example, the high quality print and low cost of the printer can be realized.

By applying the invention to such an apparatus, the fairly low cost, miniaturization, and always high quality print can be realized.

FIG. 8 shows a whole control flowchart by the CPU 1 regarding the printing in the case where the invention is applied to the foregoing apparatus. The processing routine shown in the flowchart of FIG. 3 can be always executed in parallel independently of the whole control program.

In FIG. 8, the power source is first turned on. In step S1, a check is made to see if a key input has been performed or not. In the case of executing the input/edition processes using a display or the like, the processes are executed in steps S2 and S3. In the case of executing the print, step S4 follows and the print mode is determined. In step S5, a check is made to see if the print is actually being executed by a thermal head or the print is not actually performed, namely, the carriage return is being executed or a paper is being fed or the like. If the print is not performed, step S6 follows and a preparation is made to control to amount of current to be supplied to the head upon printing on the basis of the data obtained from FIG. 3. Then, in step S7, the current is actually supplied to the head and the print is started.

I claim:

1. A resistivity value measuring circuit comprising:
   accumulating means for accumulating charges;
   switching means for electrically connecting a target element whose resistivity value is to be measured to said accumulating means;
   discharging means for discharging the charges accumulated in said accumulating means; and
   measuring means for repetitively measuring a first time period and a second time period by executing the connecting operation by said switching means, wherein during the first time period, charges are accumulated in said accumulating means only through a reference element such that a voltage across said accumulating means reaches a predetermined value, and wherein during the second time period, charges are accumulated in said accumulating means through the reference element and the target element such that a voltage across said accumulating means reaches the predetermined value, wherein the resistivity value of the target element is determined on the basis of the ratio of the first time period to the second time period.

2. A circuit according to claim 1, wherein said reference element is a reference resistor, the target element is a temperature dependency resistor, said accumulating means is a capacitor, and said switching means and said discharging means are transistors.

3. A circuit according to claim 1, further comprising means for detecting whether printing is being executed, wherein the resistivity value measurement is performed when said detecting means detects no printing.

4. A circuit according to claim 1, further comprising means for detecting whether said circuit is in a printing mode, wherein the resistivity value measurement is performed in the printing mode.

5. A method of measuring a resistivity value including:
   a reference element of a known resistivity value;
   a target element whose resistivity value is to be measured;
   accumulating means for accumulating charges;
   discharging means for discharging the charges accumulated in said accumulating means; and
   measuring means for measuring a first time period and a second time period, wherein during the first time period, charges are accumulated in said accumulating means only through said reference element such that a voltage across said accumulating means reaches a predetermined value, and wherein during the second time period, charges are accumulated in said accumulating means through the reference element and the target element such that a voltage across said accumulating means reaches the predetermined value,
   wherein the resistivity value of the target element is determined on the basis of the ratio of the first time period to the second time period.

6. A method according to claim 5, further comprising means for detecting whether printing is being executed, wherein the resistivity value measurement is performed when said detecting means detects no printing.

7. A method according to claim 5 wherein said reference element is a reference resistor, the target element is a temperature dependency resistor, and said accumulating means is a capacitor.

8. A method according to claim 5, further comprising means for detecting whether said circuit is in a printing mode, wherein the resistivity value measurement is performed in the printing mode.

9. A resistivity value measuring circuit comprising:
   first charging means comprising a reference element;
   second charging means comprising a target element whose resistivity value is to be measured;
   charge accumulating means of accumulating charges through said first and second charging means;
   switching means for electrically disconnecting said second chargng means from said charge accumulating means;
   discharging means for discharging the charges accumulated by said charge accumulating means; and
   voltage detecting means whose logic level is inverted when a voltage across said charge accumulating means reaches a predetermined value,
   wherein a first time period is measured starting when said second charging means is disconnected from said charge accumulating means by said switching means after discharge by said discharging means and ending when the logic level of said voltage detecting means is inverted, the charges being accumulated by said charge accumulating means only through said first charging means during the first time period,
   wherein a second time period is measured starting when said switching means is turned off after discharge by said discharging means and ending when the logic level of said voltage detecting means is inverted, the charges being accumulated by said charge accumulating means through said first and second charging means during the second time period,
   wherein the resistivity value of the target element is determined on the basis of the ratio of the first time period to the second time period.

10. A circuit according to claim 9, wherein said reference element is a reference resistor, said target element is a temperature dependency resistor, said charge accumulating means is a capacitor, said voltage detecting means consists of a comparator and a reference voltage to consists of a logic IC, and said switching means and said discharging means are transistors.

11. A circuit according to claim 9, further comprising means for detecting whether printing is being executed, wherein the resistivity value measurement is performed when said detecting means detects no printing.

12. A circuit according to claim 9, further comprising means for detecting whether said circuit is in a printing mode, wherein the resisitvity value measurement is performed in the printing mode.

* * * * *

UNITED STATES PATENT AND TRADEMARK OFFICE
CERTIFICATE OF CORRECTION

PATENT NO. : 4,910,689

DATED : March 20, 1990

INVENTOR(S) : Shibamiya

It is certified that error appears in the above-identified patent and that said Letters Patent is hereby corrected as shown below:

On the title page:

[56] References Cited:

U.S. PATENT DOCUMENTS

"4,272,822 6/1987 Yasuhara et al." should read --4,272,822 6/1981 Yasuhara et al.--.

[56] References Cited:

OTHER PUBLICATIONS

"E. Lubairn," should read --E. Lubavin--.

[57] ABSTRACT:

Line 5, "to" should read --for--.

Line 17, "correspond" should read --to correspond--.

COLUMN 1:

Line 44, "correciing" should read --correcting--.

UNITED STATES PATENT AND TRADEMARK OFFICE
CERTIFICATE OF CORRECTION

PATENT NO. : 4,910,689
DATED : March 20, 1990
INVENTOR(S) : Shibamiya

It is certified that error appears in the above-identified patent and that said Letters Patent is hereby corrected as shown below:

COLUMN 2:

Line 60, "herein later," should read --hereinlater,--.

COLUMN 3:

Line 1, "An RAM 2" should read --A RAM 2--.

Line 7, "FIG. 2(a))" should read --FIG. 2(a)).--

Line 42, "voltage" should read --voltage.--.

Line 62, "$B_0$ specific" should read --$B_0$: specific--.

COLUMN 4:

Line 22, "value, $R_{th}$)" should read --value, $R_{th}$).--

COLUMN 5:

Line 47, "that can" should read --that they can--.

UNITED STATES PATENT AND TRADEMARK OFFICE
CERTIFICATE OF CORRECTION

PATENT NO. : 4,910,689

DATED : March 20, 1990

INVENTOR(S) : Shibamiya

It is certified that error appears in the above-identified patent and that said Letters Patent is hereby corrected as shown below:

COLUMN 6:

Line 34, "o" should read --of--.

Line 39, "charge" should read --charges--.

Line 44, "vauue" should read --value--.

Line 48, "a" should read --at--.

COLUMN 7:

Line 30, "use" should read --used--.

COLUMN 8:

Line 45, "to" (second occurrence) should read --the--.

UNITED STATES PATENT AND TRADEMARK OFFICE
CERTIFICATE OF CORRECTION

PATENT NO. : 4,910,689
DATED : March 20, 1990
INVENTOR(S) : Shibamiya

It is certified that error appears in the above-identified patent and that said Letters Patent is hereby corrected as shown below:

COLUMN 10:

Line 5, "of" should read --for--.

Line 8, "second chargng means" should read --second charging means--.

Line 40, "to" should read --or--.

Signed and Sealed this

Twelfth Day of March, 1991

Attest:

HARRY F. MANBECK, JR.

Attesting Officer

Commissioner of Patents and Trademarks